(12) United States Patent
Tanaka

(10) Patent No.: US 9,055,686 B2
(45) Date of Patent: Jun. 9, 2015

(54) EXPLOSION-PROOF ELECTRONIC DEVICE AND MANUFACTURING METHOD THEREOF

(71) Applicant: JVC KENWOOD CORPORATION, Yokohama-shi, Kanagawa (JP)

(72) Inventor: Takuya Tanaka, Yokohama (JP)

(73) Assignee: JVC KENWOOD CORPORATION, Yokohama-Shi, Kanagawa (JP)

( * ) Notice: Subject to any disclaimer, the term of this patent is extended or adjusted under 35 U.S.C. 154(b) by 152 days.

(21) Appl. No.: 13/908,464

(22) Filed: Jun. 3, 2013

(65) Prior Publication Data

US 2013/0322043 A1    Dec. 5, 2013

(30) Foreign Application Priority Data

Jun. 5, 2012   (JP) .................. 2012-128448

(51) Int. Cl.
| | |
|---|---|
| H05K 1/11 | (2006.01) |
| H05K 1/14 | (2006.01) |
| H05K 3/36 | (2006.01) |
| H05K 5/06 | (2006.01) |
| H01R 12/52 | (2011.01) |
| H01R 13/533 | (2006.01) |

(52) U.S. Cl.
CPC .................. *H05K 1/144* (2013.01); *H05K 3/36* (2013.01); *Y10T 29/49126* (2015.01); *H05K 5/064* (2013.01); *H01R 12/52* (2013.01); *H01R 13/533* (2013.01)

(58) Field of Classification Search
CPC ...... H01R 12/52; H01R 13/533; H05K 1/144; H05K 3/36; H05K 5/064
USPC ............ 361/792, 796, 752, 803, 785; 439/74, 439/75, 620, 510
See application file for complete search history.

(56) References Cited

U.S. PATENT DOCUMENTS

| | | | | |
|---|---|---|---|---|
| 5,575,686 | A | * | 11/1996 | Noschese ................ 439/620.21 |
| 5,893,245 | A | * | 4/1999 | Sekiguchi et al. .............. 52/235 |
| 6,188,583 | B1 | * | 2/2001 | Fendt et al. ................... 361/796 |
| 7,963,796 | B2 | * | 6/2011 | Sypolt et al. .................. 439/511 |
| 2006/0057869 | A1 | * | 3/2006 | Nakajima et al. ............... 439/74 |

FOREIGN PATENT DOCUMENTS

| | | | |
|---|---|---|---|
| JP | 2010154708 | * | 6/2010 |
| JP | 2010-154708 A | | 7/2010 |

* cited by examiner

*Primary Examiner* — Yuriy Semenenko
(74) *Attorney, Agent, or Firm* — Nath, Goldberg & Meyer; Jerald L. Meyer; Tiffany A. Johnson

(57) ABSTRACT

An explosion-proof electronic device includes: a first circuit board provided with a first connector on one surface thereof; and a second circuit board provided with a second connector on a surface facing the one surface of the first circuit board, the second connector being fit to the first connector. A packing is attached to a position on the second connector which is away from the surface of the second circuit board, surrounds the outer circumference of the second connector, and extends toward the first circuit board to form a closed space including an interface between the first and second connectors. The space between the first and second circuit boards is filled with a filler with the first and second connectors fit to each other.

4 Claims, 8 Drawing Sheets

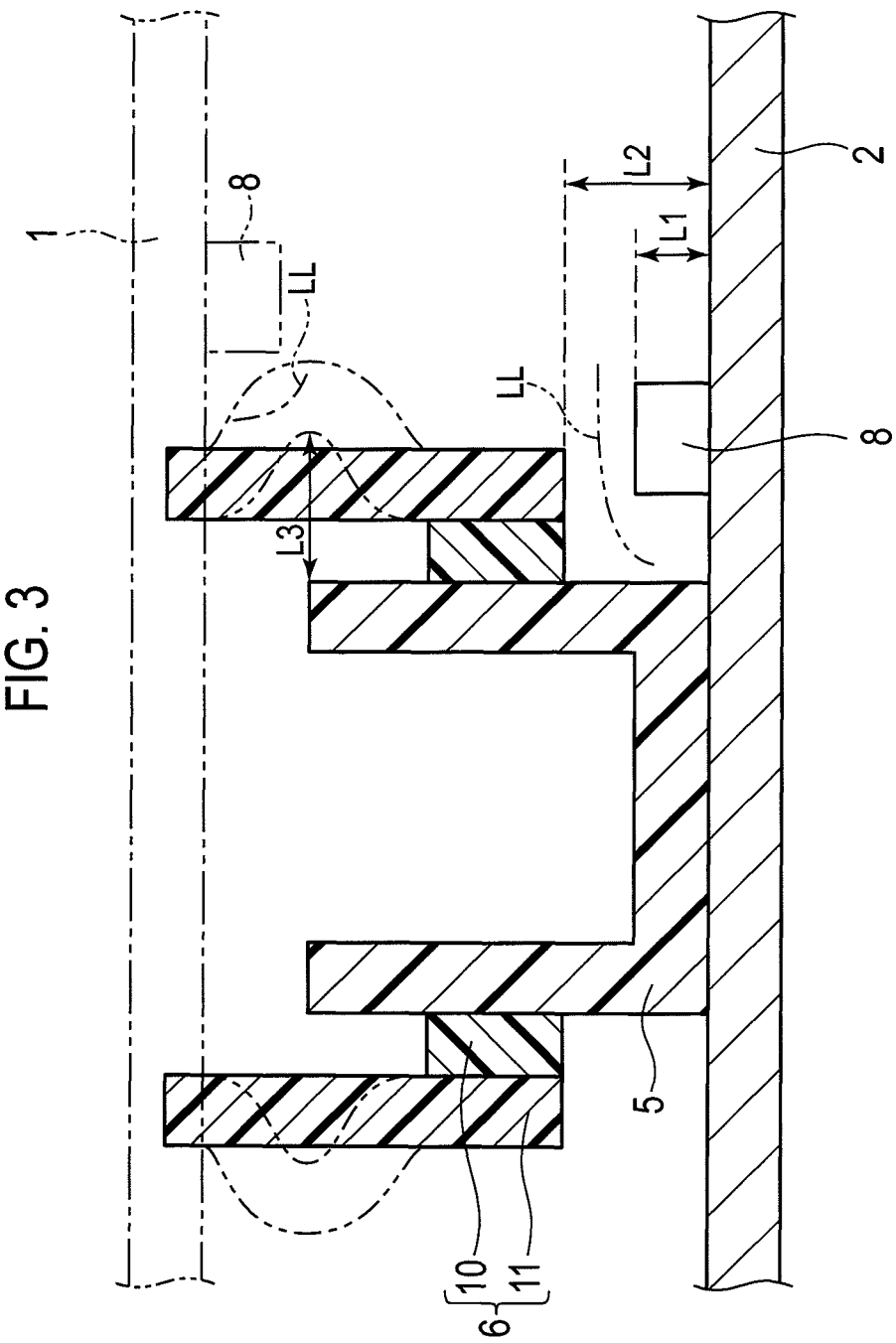

EXPLOSION-PROOF ELECTRONIC DEVICE AND MANUFACTURING METHOD THEREOF

CROSS REFERENCE TO RELATED APPLICATION

This application is based upon and claims the benefit of priority under 35 U.S.C. §119 from Japanese Patent Application No. 2012-128448, filed on Jun. 5, 2012, the entire contents of which are incorporated herein by reference.

BACKGROUND

The embodiments relate to an explosion-proof electronic device and a manufacturing method thereof.

In environments where combustible gas is generated, such as in petroleum refining plants, crude stations, and paint factories, or in environments where dust is generated, such as in coal mines, explosion-proof electronic devices are used.

An explosion-proof electronic device has a configuration, for example, in which plural printed circuit boards with components mounted thereon are arranged and a resin filler is provided so as to cover the printed circuit boards and the components thereon. In such a configuration, combustible gas or dust can be prevented from coming into contact with the printed circuit boards and the components thereon.

The plural printed circuit boards are connected in the following manner, for example. A male connector is attached to one surface of one of the plural printed circuit boards while a female connector is attached to one surface of another printed circuit board, and the male and female connectors are fit to each other.

When the filler is put into space between the connected printed circuit boards, the filler can penetrate into the connectors through a gap at the interface between the male and female connectors and in some cases cause electrical contact failure at the connection of the connectors. From this perspective, to ensure the connection in the explosion-proof electronic devices, the filler is inhibited from penetrating into the connectors.

To solve this problem, Japanese Patent Laid-open Publication No. 2010-154708 (PTL 1) discloses the following technique. A connector packing is provided like a wall so as to surround the outer circumference of each connector provided on a printed circuit board. The connector packing is pressed by a member supporting plate placed facing the printed circuit board, to seal the connector. The space between the printed circuit board and member support plate is then filled with a filler. The filler can be thus prevented from penetrating into the connector.

SUMMARY

According to the technique disclosed in PTL 1, the penetration of the filler into the interface between the connectors can be prevented. This can solve the problem of electrical contact failure and secure the performance. However, since the connector packing described in PTL 1 is directly attached to the printed circuit board, electronic components cannot be arranged in and around the region of the printed circuit board where the connector packing is placed. Accordingly, electronic components need to be mounted in a smaller area of the printed circuit board.

Because of the increasing packaging density of electronic devices, the issue of the need to secure the above-mentioned region for mounting electronic components exists for other explosion-proof electronic devices as well as radios.

An object of the embodiments is to provide an explosion-proof electronic device including a structure for increasing the mounting area of electronic components and a manufacturing method of the explosion-proof electronic device.

To solve the aforementioned problems of the conventional techniques, a first aspect of the embodiments provides an explosion-proof electronic device comprising: a first circuit board provided with a first connector on one surface thereof; a second circuit board provided with a second connector on a surface facing the one surface of the first circuit board, the second connector being fit to the first connector; a packing which is attached to a position on the second connector away from the surface of the second circuit board, surrounds the outer circumference of the second connector, and extends toward the first circuit board to form a closed space including an interface between the first and second connectors, and a filler filling a space between the first and second circuit boards with the first and second connectors fit to each other.

A second aspect of the embodiments provides a method of manufacturing an explosion-proof electronic device comprising: preparing a first circuit board provided with a first connector on one surface thereof; preparing a second circuit board provided with a second connector on one surface thereof and a packing which is attached to a position on the second connector away from the one surface and protruding from the second connector to surround the outer circumference of the second connector; placing the first and second circuit boards with the first and second connectors facing each other; fitting the first and second connectors to each other to bring the end of the packing into close contact with the one surface of the first connector; and filling space between the first and second circuit boards with a filler.

BRIEF DESCRIPTION OF THE DRAWINGS

FIG. 3 is a partially enlarged cross-sectional view showing the structure of a packing.

DETAILED DESCRIPTION

Hereinafter, a description is given of an explosion-proof electronic device and a manufacturing method thereof according to an embodiment. The following description uses an explosion-proof radio as an example.

Figure 1:
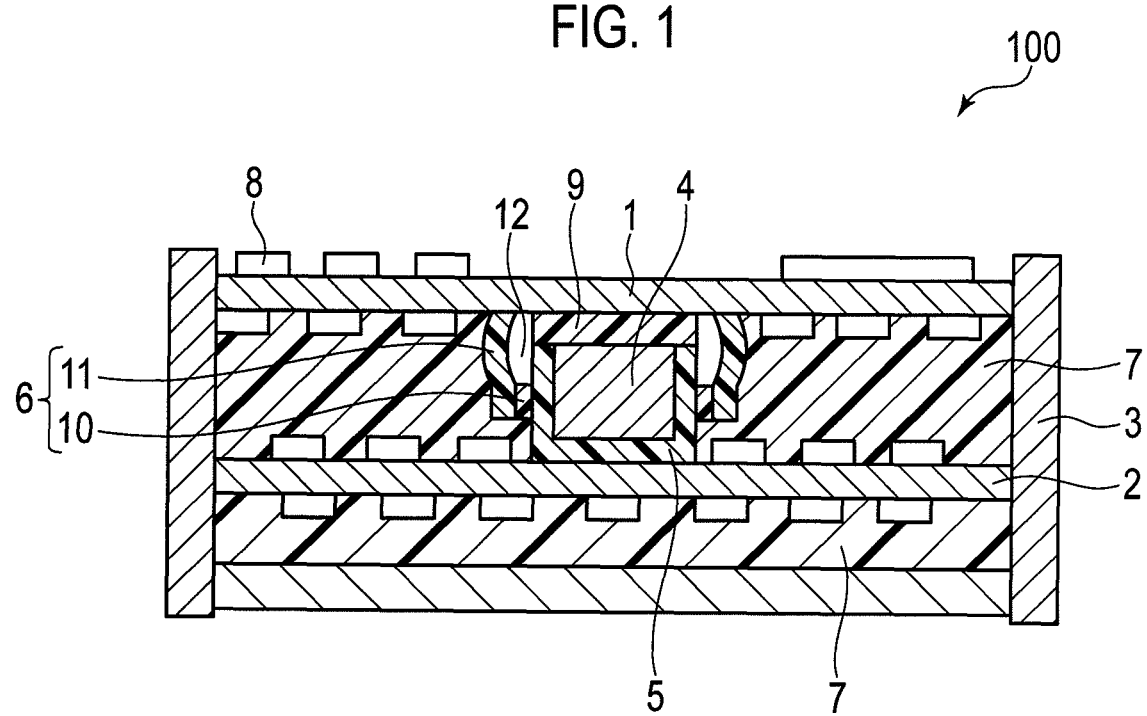
FIG. 1 is a cross-sectional view showing a structure of an explosion-proof radio according to an embodiment.

As shown in FIG. 1, an explosion-proof radio 100 of this embodiment includes a first circuit board 1, a second circuit board 2, a chassis 3, a first connector 4, a second connector 5, a packing 6, and a filler 7. Actually, the explosion-proof radio 100 is covered with an exterior case to be formed as an electronic device. The exterior case is not illustrated so as to more clearly show the internal configuration of the explosion-proof radio 100.

The first and second circuit boards 1 and 2 are rigid printed circuit boards on which electronic components are mounted, including integrated circuits, resistors, and capacitors. On the circuit boards 1 and 2, the first and second connectors 4 and 5 are arranged, respectively.

The chassis 3 is composed of a metallic container having a box shape. To the chassis 3, the first and second circuit boards 1 and 2 are attached in parallel through not-shown ribs and the like with the first and second connectors 4 and 5 fit to each other.

The first connector 4 is composed of a male connector. On one surface of the first circuit board 1, a holding member 9 is attached. The holding member 9 is made of a hard resin material such as plastic and holds the first connector 4. The holding member 9 acts as a base for the first connector 4. The surface of the first circuit board 1 to which the holding member 9 is attached is the lower surface.

Figure 2A:
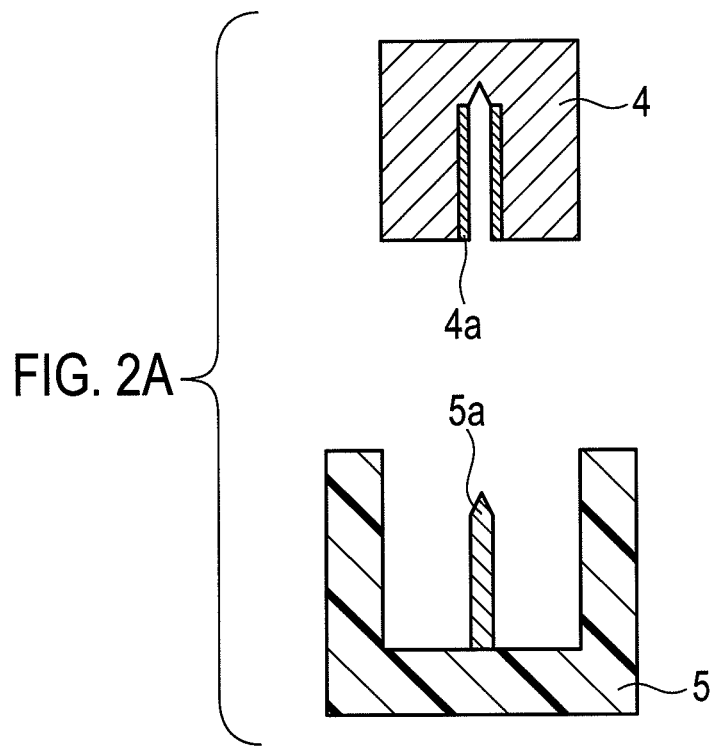
FIGS. 2A and 2B are cross-sectional views individually showing examples of the form of the connection between the first and second connectors.
Figure 2B:
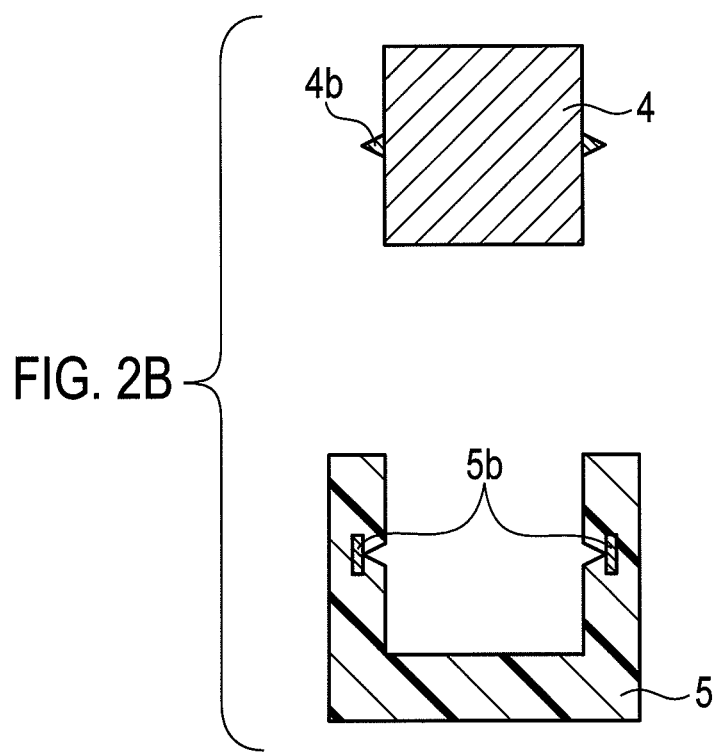

As illustrated in FIG. 2A, the first connector 4 includes a socket-type conductor portion (connection terminal) 4a. Alternatively, the first connector 4 includes pin-type conductor portions (connection terminals) 4b as shown in FIG. 2B. Each pin-type conductor portion 4b is energized by an elastic member to protrude and retract.

The conductor portions 4a and 4b are connected through not-shown wiring to printed wiring including a power line, a ground line, a signal line, and the like which are formed on the first circuit board 1.

The second connector 5 is composed of a female connector. The second connector 5 is attached to one surface of the second circuit board 2. The surface of the second circuit board 2 to which the second connector 5 is attached is the upper surface.

The second connector 5 detachably holds the first connector 4. The recess of the second connector 5 has the same shape and size as the protrusions of the first connector 4 and is capable of fitting on the first connector 4.

The side and bottom of the second connector 5 is made of a hard resin material such as plastic, for example.

In the recess of the second connector 5, as illustrated in FIG. 2A, for example, a pin-shaped conductor portion 5a is formed which can fit inside the conductor portion 4a of the first connector 4. Alternatively, as shown in FIG. 2B, socket-shaped conductor portions 5b, which come into contact with the conductor portions 4b each having a pin shape, are formed in the recess of the second connector 5.

The conductor portions 5a and 5b are connected through not-shown wiring to printed wiring including a power supply line, a ground line, a signal line, and the like which are formed on the second circuit board 2.

Accordingly, when the first connector 4 is inserted in the second connector 5, the wiring on the first circuit board 1 is electrically connected to the wiring on the second circuit board 2.

The packing 6 shown in FIG. 1 is configured to prevent the uncured filler 7 from penetrating into the connectors through the gap at the interface between the first and second connectors 4 and 5 during the manufacturing process of the explosion-proof radio 100.

The packing 6 includes: a supporting portion 10; and a wall portion 11 attached to the supporting portion 10.

The supporting portion 10 is formed of a hard insulating resin material such as plastic and surrounds the second connector 5.

As shown in the enlarged view of FIG. 3, the supporting portion 10 is attached to the outer circumference of the side surface of the second connector 5 at a position away from the upper surface of the second circuit board 2 by thermal bonding, for example.

Distance L2 between the attachment position of the supporting portion 10 and the second circuit substrate 2 is at least a predetermined distance greater than height L1 of the electronic components 8 which are attached to the second circuit board 2 in the vicinity of the second connector 5. Accordingly, the electronic components 8 can be arranged comparatively near the second connector 5. The predetermined distance is such that an insulation distance can be secured between the second connector 5 and each electronic part 8.

The wall portion 11 is formed of a material which can be elastically deformed when being pressed by the first circuit board 1, for example, silicon elastomer resin in a cylindrical shape. The wall portion 11 is attached to one side surface of the supporting portion 10 by ultrasonic welding so as to extend toward the first circuit board 1 and surround the second connector 5.

The length of the wall portion 11 measured from the lower end thereof as the end on the second circuit board 2 side to the upper end as the end on the first circuit board 1 side, is longer than the distance between the lower end of the wall portion 11 and the lower surface of the first circuit substrate 1 when the first and second connectors 4 and 5 are fit to each other.

When the first and second connectors 4 and 5 are fit to each other, as indicated by dashed lines in FIG. 3, the upper end of the wall portion 11 comes into contact with the lower surface of the first circuit board 1 and is pressed by the same into close contact with the first circuit board 1.

The wall portion 11 is deformed into a circular shape protruding outward (in the direction of separation) with respect to the interface between the first and second connectors 4 and 5. As shown in FIG. 1, void 12 is formed between the second connector 5 (and the holding member 9) and wall portion 11.

The distance between the deformed wall portion 11 and each electronic part 8 mounted on the first circuit substrate 1 satisfies the separation distance prescribed in the explosion-proof standards, IEC60079-0 or 60079-11.

The filler 7 is thermosetting resin such as epoxy resin, for example, and fills the space between the first and second circuit substrates 1 and 2 and the space between the second circuit substrate 2 and the bottom surface of the chassis 3 in order to prevent the electronic components 8 from coming into contact with combustible gas or dust. However, the filler 7 is not inserted into the void 12, which is a closed (air-tight) space formed by the second connector 5, packing 6, and first circuit substrate 1.

The electronic components 8 are various types of electronic components constituting the radio, including passive elements such as resistive elements and capacitative elements, semiconductor chips, display devices, various switches, buttons, and the like.

For example, on the upper surface (exposed surface) of the first circuit board 1, parts for operation such as key switches and buttons and a display panel such as a liquid-crystal display element, which are user interfaces, are arranged. Alternatively, other parts that need to be exposed outside, such as a lens, are arranged on the upper surface thereof. On the lower surface of the first circuit board 1 and the second circuit board 2, parts which do not need to be exposed are arranged.

The size of the void 12 and the positions of the electronic components 8 arranged near the first and second connectors 4 and 5 are set based on the voltage applied to each electronic part 8 and the distances between each electronic part 8 and adjacent electronic components so as to satisfy the explosion-proof standards, IEC60079-0 or 60079-11.

Accordingly, as shown in FIG. 3, each electronic part 8 is arranged at a position farther from the packing 6 than limit line LL located at a predetermined distance away from the packing 6. The predetermined distance is determined by the applied voltage.

Next, a description is given of a method of manufacturing the explosion-proof radio 100 with reference to FIGS. 4A to 4D and FIGS. 5E to 5G.

Figure 4A:
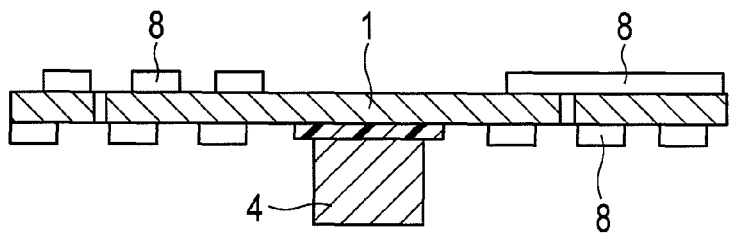
FIGS. 4A to 4D and FIGS. 5E to 5G are cross-sectional views showing the manufacturing procedure of the explosion-proof radio according to the embodiment.

First, as shown in FIG. 4A, the first connector 4, some electronic components 8, and the like are placed at predetermined positions on the first circuit board 1 provided with printed wiring.

Figure 4B:
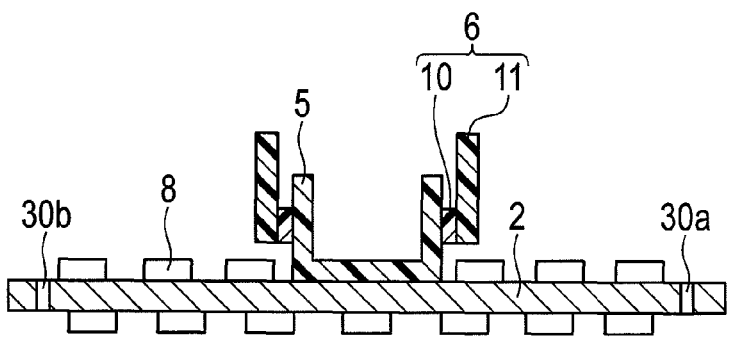

As shown in FIG. 4B, the second connector 5, the electronic components 8, and the like are placed at predetermined positions on the second circuit board 2 provided with printed wiring. The supporting portion 10 is fixed to a predetermined position on the second connector 5 by thermal bonding or the like, and, the wall portion 11 is then attached to the supporting portion 10.

Figure 4C:
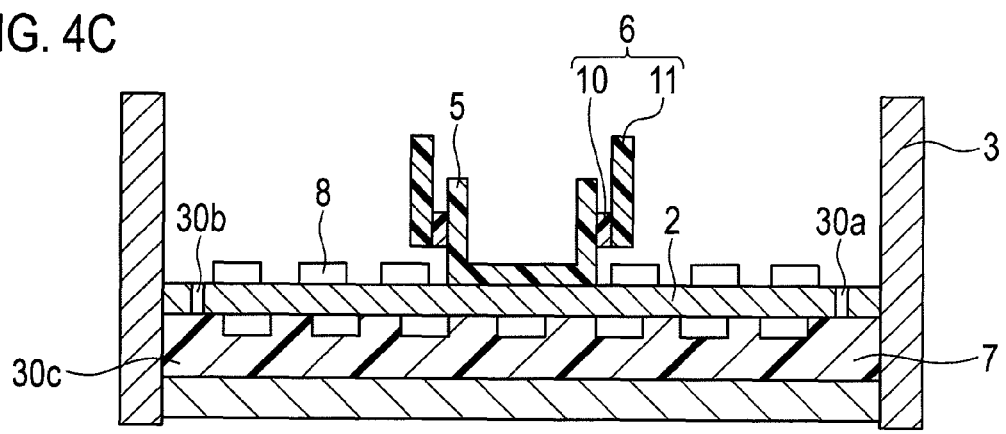

Next, as shown in FIG. 4C, the second circuit board 2 is placed in the chassis 3 so as to face the bottom surface of the chassis 3.

The thermosetting filler 7 is injected from a first filler inlet 30a, which is provided at an end of the second circuit board 2. Due to the filler 7, air in space 30c between the second circuit board 2 and the bottom surface of the chassis 3 is forced out through a first air outlet 30b, which is provided at the other end of the second circuit board 2. After the space 30c is filled, the filler 7 filling the space 30c is heated and cured.

Figure 4D:
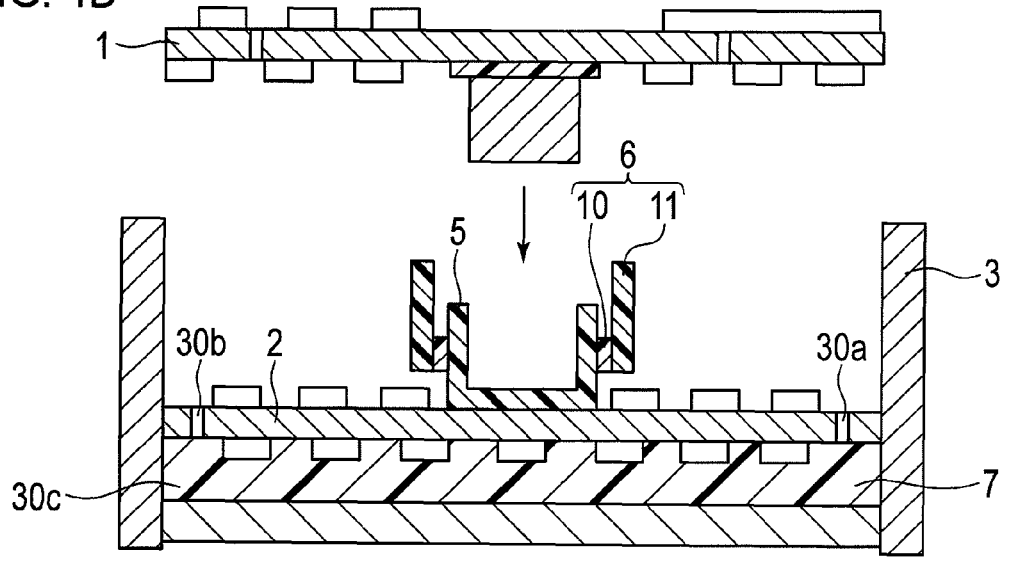

Subsequently, as shown in FIG. 4D, the first circuit board 1 is placed facing the second circuit substrate 2 so that the protrusion of the first connector 4 faces the recess of the second connector 5. The first circuit board 1 is then moved in the direction indicated by an arrow in FIG. 4D, and the tip of the protrusion of the first connector 4 is inserted into the recess of the second connector 5.

Figure 5E:
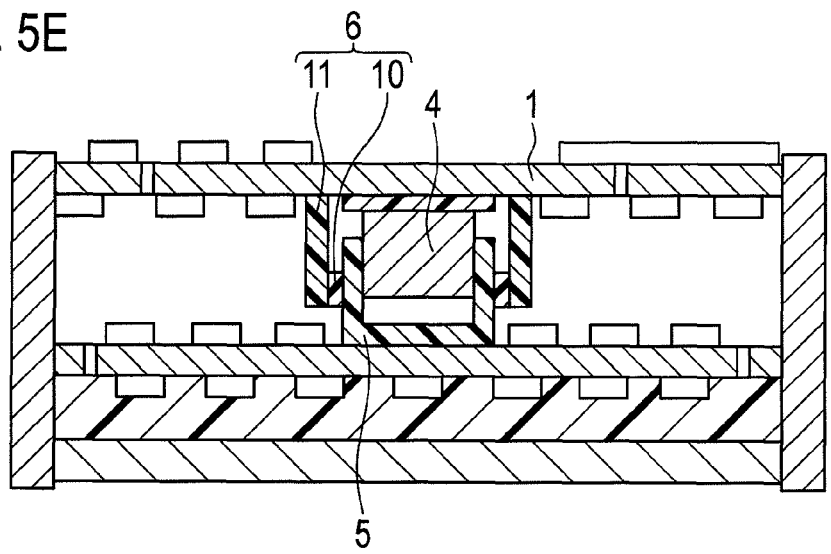

When the protrusion of the first connector 4 is further pressed into the recess of the second connector 5, as shown in FIG. 5E, the lower surface of the first circuit board 1 comes into contact with the upper end of the wall portion 11 of the packing 6.

Figure 5F:
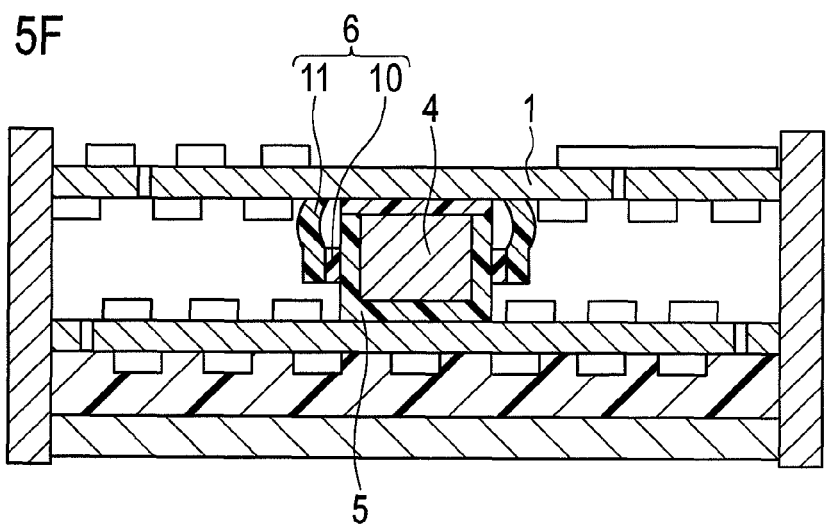

When the protrusion of the first connector 4 is still further pressed into the recess of the second connector 5, as shown in FIG. 5F, the first connector 4 is fit into the second connector 5.

The conductor portion 4a of the first connector 4 and the conductor portion 5a of the second connector 5, which are shown in FIG. 2A, or the conductor portions 4b and the conductor portions 5b which are shown in FIG. 2B, are connected to each other, thus electrically connecting the first and second circuit boards 1 and 2.

At this time, the upper end of the wall portion 11 is pressed by the first circuit board 1 into close contact with the first circuit board 1. As indicated by the dashed line of FIG. 3, the wall portion 11 deforms into a circular shape bulging outward with respect to the interface between the first and second connectors 4 and 5.

In the aforementioned manner, the first and second circuit boards 1 and 2 are placed within the chassis 3 in a state where the first connector 4 connected to the first circuit board 1 is connected to the second connector 5 provided on the second circuit board 2.

The packing 6 is placed at a position on the second connector 5 away from the upper surface of the second circuit board 2 and surrounds the outer circumference of the second connector 5. The packing 6 extends toward the first circuit board 1, and the upper end thereof is in contact with the first circuit board 1. The packing 6 forms a closed space including the interface between the first and second connectors 4 and 5.

Figure 5G:
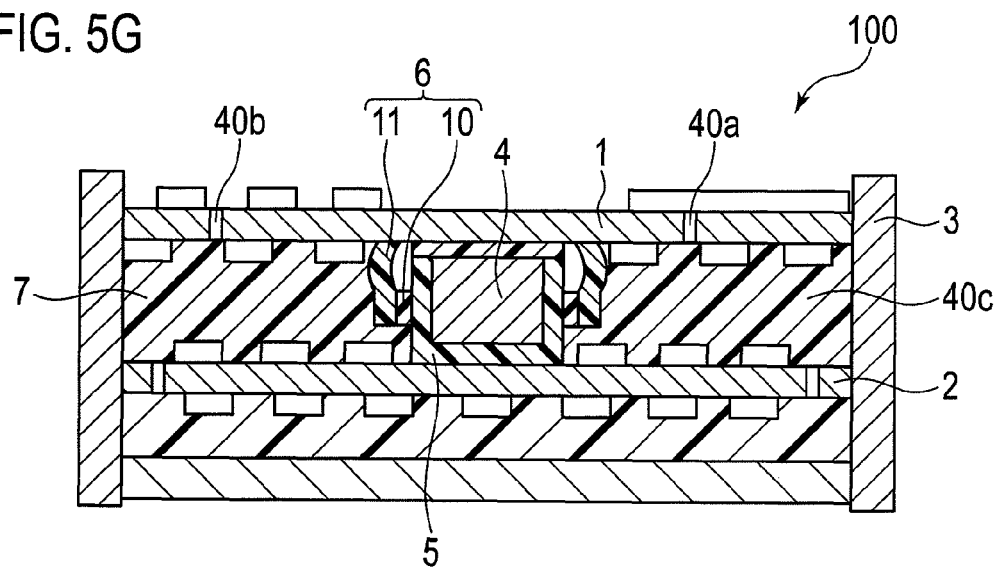

Subsequently, as shown in FIG. 5G, the uncured filler 7 is injected from a second filler inlet 40a, which is provided at an end of the first circuit board 1, until the upper surface of the filler 7 reaches the first circuit board 1.

Due to the injected filler 7, air in space 40c between the first and second circuit boards 1 and 2 is forced out through a second air outlet 40b, which is provided at the other end of the first circuit board 1.

At this time, the second connector 5, packing 6, and first circuit board 1 form a closed airtight space to prevent the filler 7 from penetrating into the interface between the first and second connectors 4 and 5.

After the filling is finished, the filler 7 filled in the space 40c is heated to be cured. The explosion-proof radio 100 filled with the filler 7 is thus completed.

As described above, in the explosion-proof radio 100 of this embodiment, the packing 6 is attached to the outer side surface of the second connector 5 at a predetermined distance away from the second circuit board 2. Compared with the configuration where the packing 6 is directly placed on the second circuit board 2, the electronic components 8 can be arranged in the vicinity of the second connector 5, and the mounting area for electronic components on the second circuit board 2 can be increased.

The circuit board of the embodiment can be designed to be miniaturized given the same number of electronic components, thus contributing to miniaturization of the explosion-proof radio.

The above-described embodiment is shown by way of example and does not limit the technical scope of the present invention. The present invention can be freely modified, adapted, or improved within the scope of the technical idea described in the claims.

For example, in the example shown in the above embodiment, the first connector 4 is held by the holding member 9 and attached to the rigid first circuit board 1.

Figure 6A:
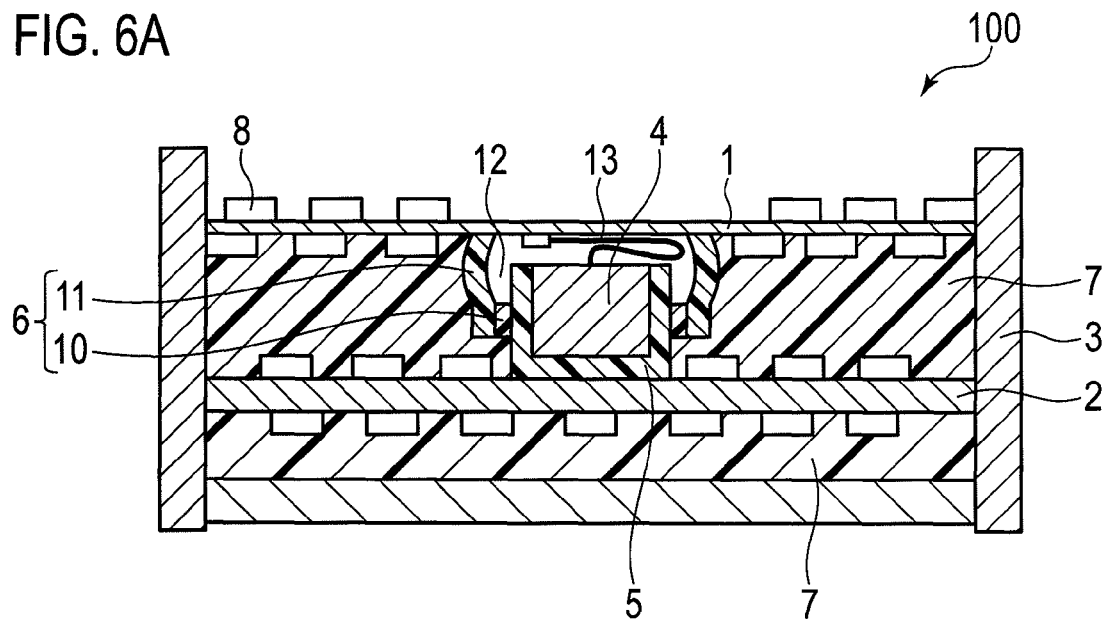
FIG. 6A is a cross-sectional view showing another example of the connection between the first connector and the first circuit board.

As illustrated in FIG. 6A, it is possible to use a flexible printed circuit board as the first circuit board 1 and connect the first connector 4 to the first circuit board 1 through a cable 13 instead of directly fixing the first connector 4 to the first circuit board 1.

Figure 6B:
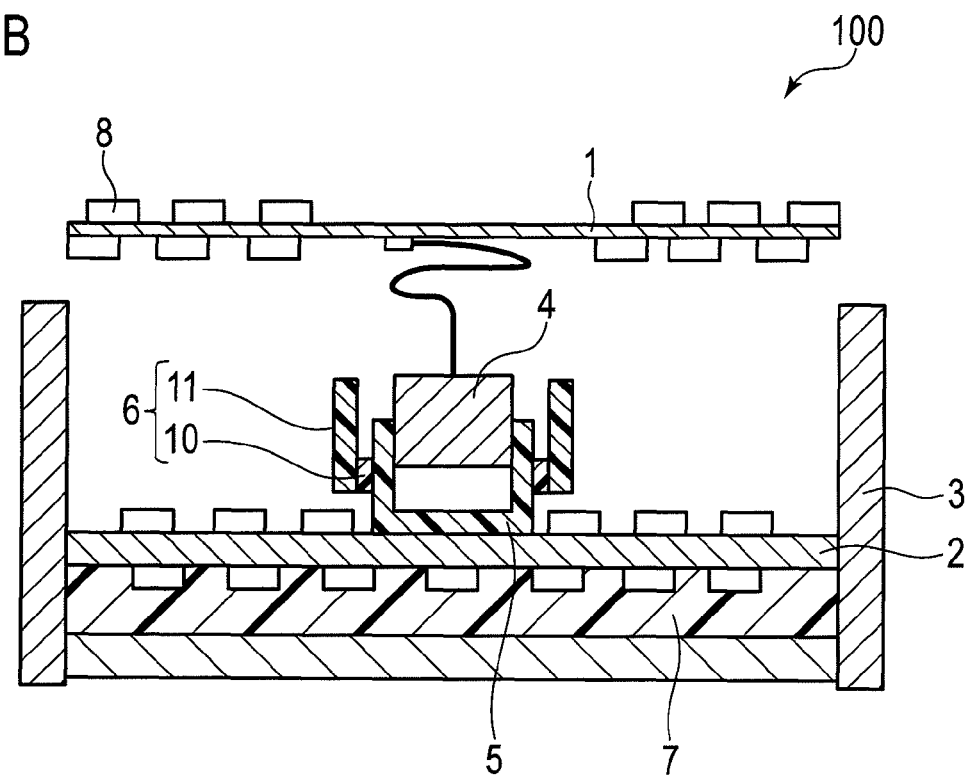
FIG. 6B is a cross-sectional view showing a manufacturing step of the explosion-proof radio of FIG. 6A.
Figure 7:
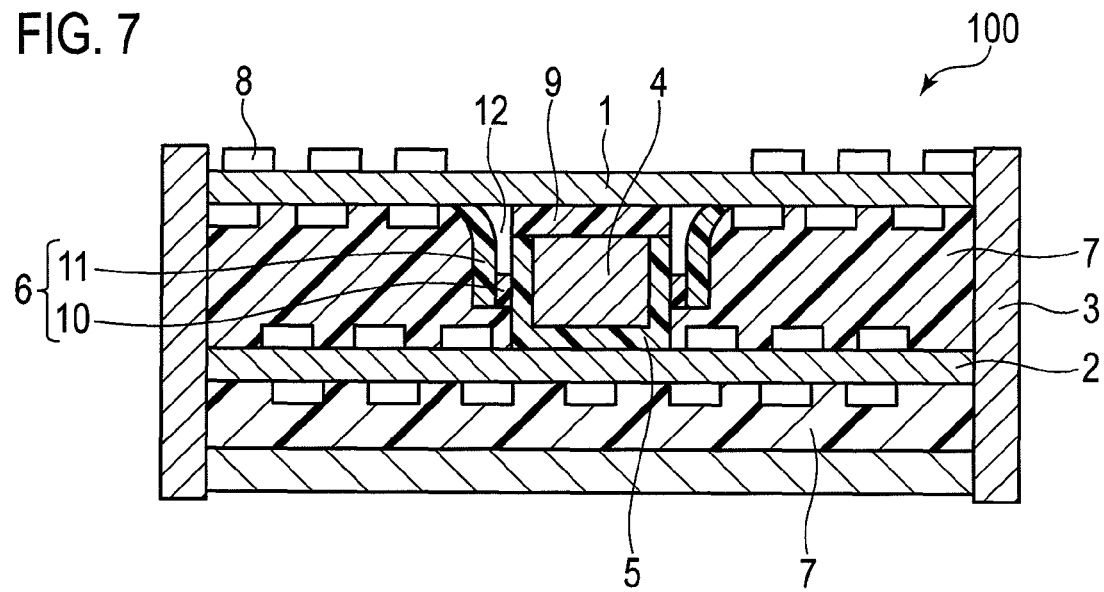
FIG. 7 is a cross-sectional view showing another deformed state of a wall portion of the packing pressed by the first circuit board.

In this case, as shown in FIG. 6B, the first circuit board 1 can be fixed to the chassis 3 after the first connector 4 is fit into the second connector 5.

With such a configuration, the first circuit board 1 can be deformed so as to protrude downward to be attached to the chassis 3. Accordingly, the space between the first and second circuit boards 1 and 2 can be filled with a smaller amount of filler 7. Moreover, as a flexible printed circuit board is lighter than a rigid circuit board, the above configuration can contribute to weight reduction of the explosion-proof radio.

In the example described in the above embodiment, the wall portion 11 may be deformed into a shape widening as the distance from the support portion 10 increases toward the first circuit substrate 1. In the case where the position of attachment of the supporting portion 10 and the length of the wall portion 11 are the same as those of the example of FIG. 1, when the wall portion 11 is deformed in such a manner, the wall portion 11 is shrunk more in the vertical direction and presses back the first circuit board 1 with larger force than the case of the above embodiment.

Accordingly, compared with the example shown in FIG. 1, the wall portion 11 can be firmly fixed between the first circuit board 1 and supporting portion 10. The wall portion 11 may be deformed in an arbitrary manner. However, it is desirable that the wall portion 11 be deformed so as to be separated from the interface between the first and second connectors 4 and 5 when being pressed by the first circuit board 1.

Figure 8:
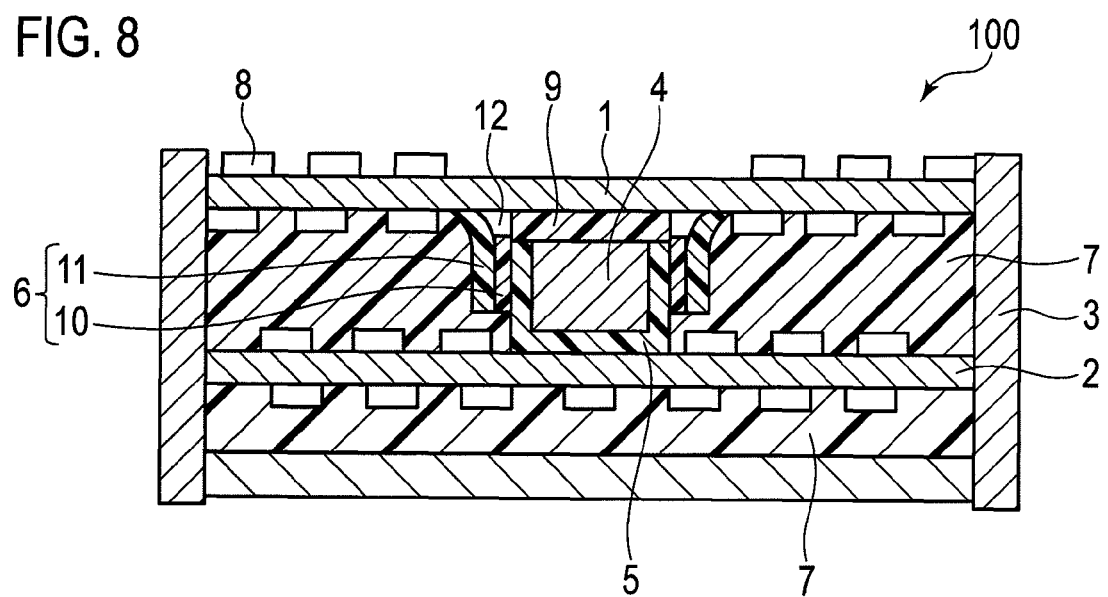
FIG. 8 is a cross-sectional view showing a modification of a supporting portion of the packing.

As shown in FIG. 8, the supporting portion 10 constituting the packing 6 may be configured to extend to the interface between the first and second connectors 4 and 5 and cover the same, for example.

In the example described in the above embodiment, the wall portion 11 is in direct contact with the first circuit board 1. However, the first circuit board 1 may be provided with a receiver which is brought into pressure contact with or fit to the upper end of the wall portion 11.

Figure 9:
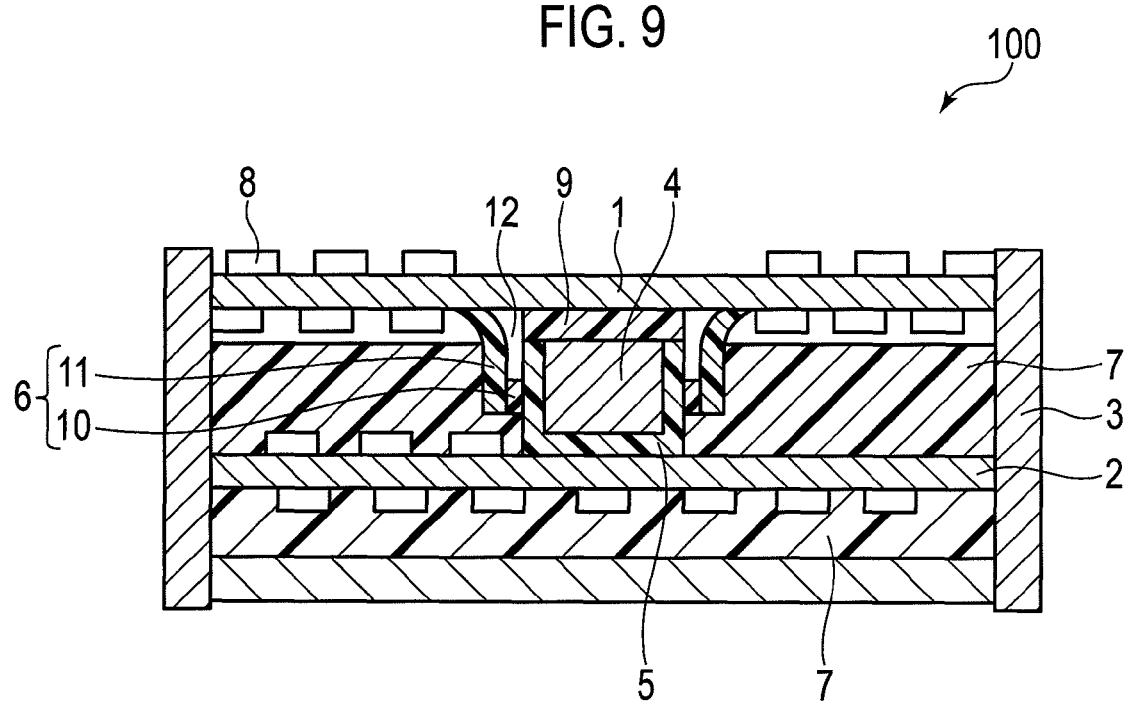
FIG. 9 is a cross-sectional view showing another example of the way of providing a filler.

In the aforementioned example, the filler 7 is injected up to the same plane as the lower surface of the first circuit board 1. However, as shown in FIG. 9, there may be void between the filler 7 and the first circuit board 1.

Moreover, in the aforementioned example, the second circuit board 2 is placed in the lower part of the chassis 3 while the first circuit board 1 is placed in the upper part of the chassis 3. However, the second circuit board 2 may be placed in the upper part of the chassis 3 while the first circuit board 1 is placed in the lower part of the chassis 3.

In the example shown in the above embodiment, the electronic components 8 including integrated circuits, resistors, capacitors, and the like are arranged on both surfaces of the first circuit board 1. However, the arranged components are not limited to those devices and can be anything.

Moreover, in the example shown in the above embodiment, the explosion-proof radio includes two circuit boards. However, the radio may include three or more circuit boards.

In the above embodiment, the filler 7 is first injected into only the space between the second circuit substrate 2 and chassis 3 to be cured. Thereafter, the first circuit board 1 is fit to the second circuit board 2 before the filler 7 is injected into the space between the first and second circuit boards 1 and 2 for curing. However, the present invention is not limited to such a way of filling in plural steps, and a method is applicable, which first fits the first circuit board 1 to the second circuit board 2 and then injects the filler 7 at one time for curing.

Furthermore, the aforementioned embodiment shows the explosion-proof radio 100 by way of example. However, the present invention is also applicable to other explosion-proof electronic devices each including plural circuit boards.

What is claimed is:

1. An explosion-proof electronic device comprising:
   a first circuit board provided with a first connector on one surface thereof;
   a second circuit board provided with a second connector on a surface facing the one surface of the first circuit board, the second connector being fit to the first connector;
   a packing which is attached to a position on the second connector which is away from the surface of the second circuit board, surrounds the outer circumference of the second connector, and extends toward the first circuit board to form a closed space including an interface between the first and second connectors, and
   a filler filling a space between the first and second circuit boards with the first and second connectors fit to each other, wherein
   the packing includes:
   a supporting portion which is attached at a predetermined distance away from the second circuit board on the side surface of the second connector and surrounds the outer circumference of the second connector; and
   a wall portion which is attached to the supporting portion and extends toward the first circuit board, and wherein
   a length of the wall portion, measured from a first end of the wall portion on the second circuit board side to a second end on the first circuit board side is greater than the distance between the position of the first end and the surface of the first circuit board when the first and second connectors are fit to each other,
   the first end of the wall portion comes into close contact with the one surface of the first circuit board by being pressed by the first circuit board.

2. The explosion-proof electronic device according to claim 1, wherein the wall portion is elastically deformed in a direction of separation from the interface between the first and second connectors.

3. The explosion-proof electronic device according to claim 1, wherein the wall portion is formed of silicon elastomer resin.

4. The explosion-proof electronic device according to claim 1, wherein the interval between the second circuit substrate and the packing is at least a predetermined distance greater than a height of an electronic component placed near the packing.

* * * * *